United States Patent [19]

Chen et al.

[11] Patent Number: 5,774,368
[45] Date of Patent: Jun. 30, 1998

[54] CONTROLLER STRUCTURE TEMPLATE AND METHOD FOR DESIGNING A CONTROLLER STRUCTURE

[75] Inventors: Chih-Tung Chen, Chandler; Kayhan Kucukcakar, Scottsdale; Thomas E. Tkacik, Phoenix, all of Ariz.; Rajesh Gupta, Bombay, India

[73] Assignee: Motorola, Inc., Schaumberg, Ill.

[21] Appl. No.: 546,044

[22] Filed: Oct. 20, 1995

[51] Int. Cl.$^6$ .................................................. G06F 17/50
[52] U.S. Cl. ......................... 364/488; 364/489; 364/490; 364/491
[58] Field of Search .................................. 364/488–491, 364/578; 324/754

[56] References Cited

U.S. PATENT DOCUMENTS

| | | | |
|---|---|---|---|
| 5,247,651 | 9/1993 | Clarisse | 395/500 |
| 5,491,640 | 2/1996 | Sharma et al. | 364/488 |
| 5,513,122 | 4/1996 | Cheng et al. | 364/489 |
| 5,530,370 | 6/1996 | Langhof et al. | 324/754 |
| 5,537,580 | 7/1996 | Giomi et al. | 395/500 |
| 5,541,849 | 7/1996 | Rostoker et al. | 364/489 |
| 5,594,657 | 1/1997 | Cantone et al. | 365/490 |
| 5,600,567 | 2/1997 | Kucukcakar et al. | 364/488 |
| 5,661,662 | 8/1997 | Butts et al. | 364/489 |

OTHER PUBLICATIONS

Mukherjee et al. ("Synthesis of optimal 1–hot coded on–chip controllers for BIST hardware", IEEE Comput. Soc. Press, 1991 IEEE International Conference on Computer–Aided Design, 11 Nov. 1991, pp. 236–239).

Mukherjee et al. ("Minimal area merger of finite state machine controllers," IEEE Comput. Soc. Press, European Design Automation Conference, 7 Sep. 1992, pp. 278–283).

Navabi et al. ("Templates for synthesis from VHDL", IEEE Proceedings: Third Annual IEEE ASIC Seminar and Exhibit, pp. P16/1.1–4), Sep. 17, 1990.

Rahmouni et al. ("Formulation and evaluation of scheduling techniques for control flow graphs", IEEE Comput. Soc. Press, Proceedings EURO–DAC: Sep. 18–22, 1995 European Design Automation Conference with EURO–VHDL, pp. 386–391).

Ecker ("Semi–dynamic scheduling of synchronization–mechanisms", IEEE Comput. Soc. Press, Proceedings EURO–DAC Sep. 18–22, 1995: European Design Automation Conference with EURO–VHDL, pp. 374–379).

McFarland et al. ("Tutorial on High–Level Synthesis", 25th ACM/IEEE Design Automation Conference, 1988 IEEE, pp. 330–336).

Ecker et al. ("VHDL–based communication–and synchronization synthesis", IEEE Comput. Soc. Press, Proceedings EURO–DAC Sep. 18–22, 1995: European Design Automation Conference with EURO–VHDL, pp. 458–462).

Eles et al. ("Timing constraint specification and synthesis in behavioral VHDL", IEEE Comput. Soc. Press, Proceedings EURO–DAC: Sep. 18–22, 1995 European Design Automation Conference with EURO–VHDL, pp. 452–457).

(List continued on next page.)

*Primary Examiner*—Emanuel Todd Voeltz
*Assistant Examiner*—Phallaka Kik
*Attorney, Agent, or Firm*—Rennie William Dover

[57] ABSTRACT

A controller structure template (60) and method (10) of using the controller structure template (60) for designing a controller structure is provided. The method includes providing (11) a behavioral specification, scheduling, allocating, and binding the behavioral specification (12), dividing (13) the list of statements into statement blocks, clustering (14) the list of statements from each statement block, mapping (15) each statement block into a control block, and mapping (17) each cluster into a control element. The steps of mapping (15 and 17) are performed using a controller structure template (60), which includes a control element template (62), merging logic circuit (63), detection circuit (64), branching logic (67).

22 Claims, 3 Drawing Sheets

OTHER PUBLICATIONS

Narayan et al. ("System clock estimation based on clock slack minimization", IEEE Comput. Soc. Press, EURO-DAC Sep. 7–10 1992: European Design Automation Conference, pp. 66–71).

Kuehlmann et al. ("High–level state machine specification and synthesis", IEEE Comput. Soc. Press, IEEE Oct. 11–14 1992 International Conference on Computer Design: VLSI in Computers and Processors, pp. 536–539).

Michael C. McFarland, SJ, Alice C. Parker, and Raul Camposano, "Tutorial on High–Level Synthesis", 25th ACM/IEEE Design Automation Conference, 1988 IEEE, pp. 330–336, Jan. 1, 1988.

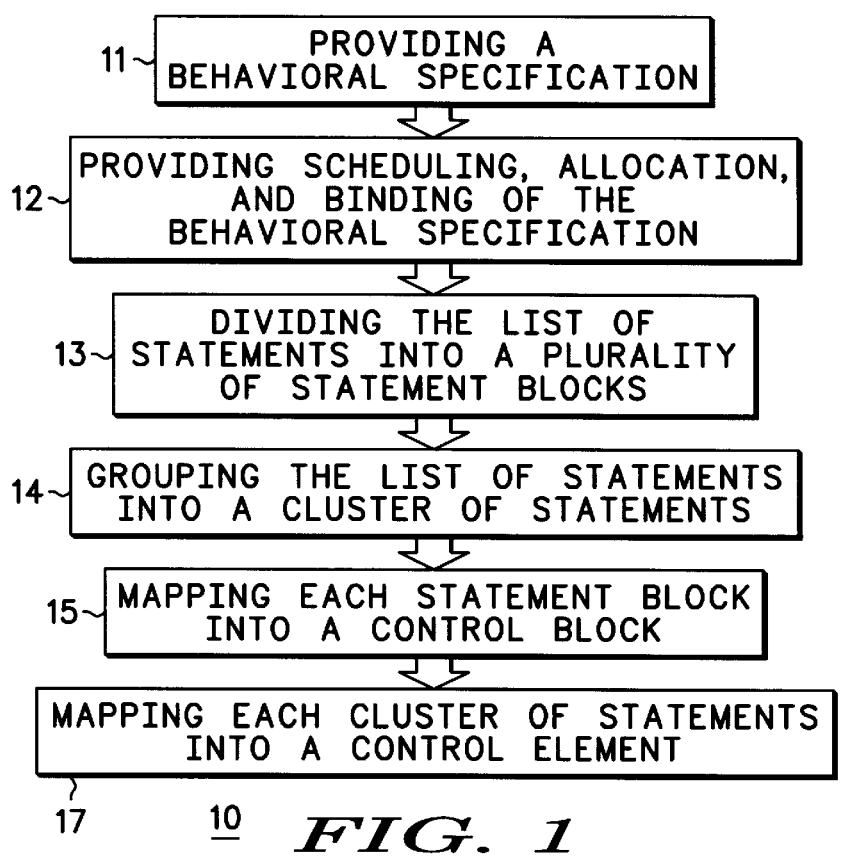
FIG. 1
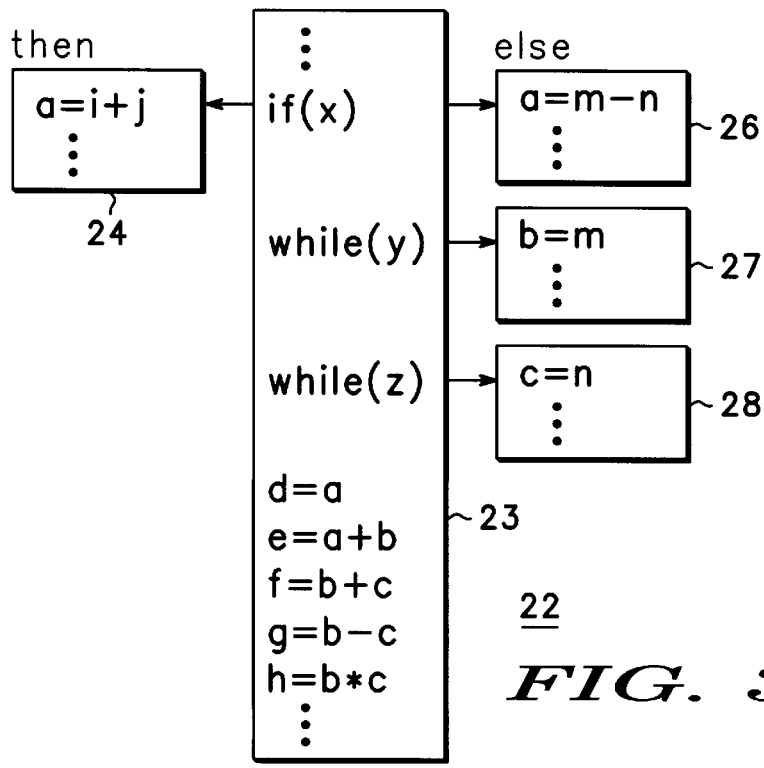
FIG. 2
FIG. 3

| | 32 | 33 | 34 | 35 | 36 |
|---|---|---|---|---|---|
| if(x) | A | U | | 1 |
| while(y) | A | U | | 1 |
| while(z) | A | U | | 1 |
| d=a | R | U | | 1 |
| e=a+b | R | U | | 1 |
| f=b+c | R | S | | 2 |
| g=b−c | R | S | | 2 |
| h=b*c | R | S | | 3 |
FIG. 4
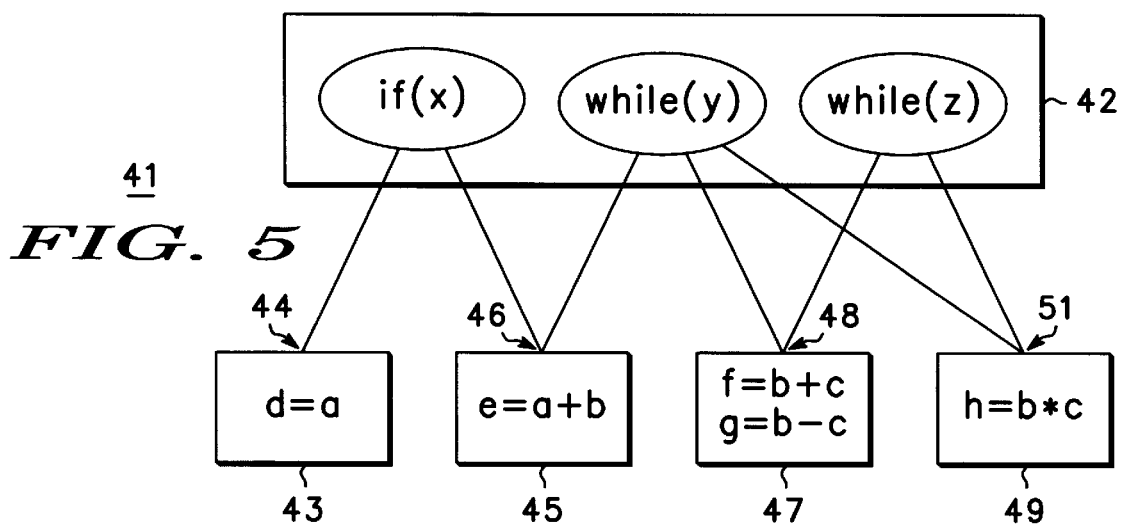
FIG. 5
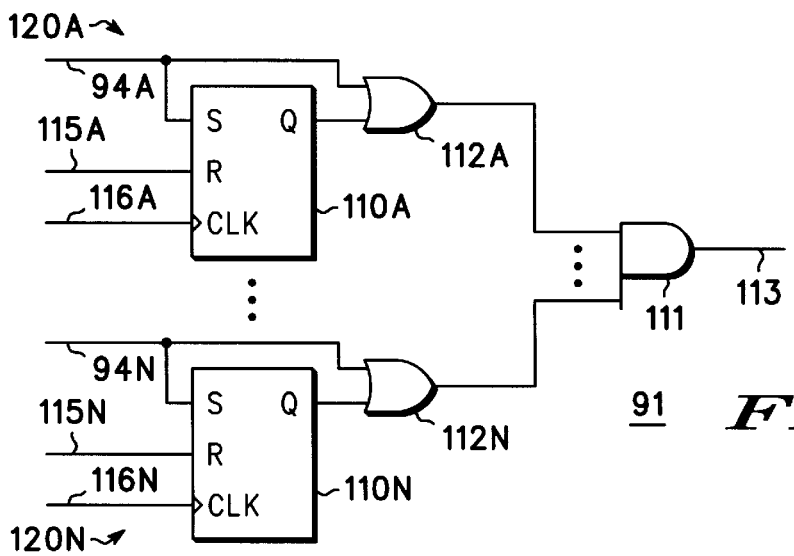
FIG. 8

CONTROLLER STRUCTURE TEMPLATE AND METHOD FOR DESIGNING A CONTROLLER STRUCTURE

BACKGROUND OF THE INVENTION

The present invention relates, in general, to the high-level synthesis of an electrical system, and more particularly, to the synthesis of a controller structure.

The task of synthesizing an electrical system using high-level synthesis comprises converting a specification of a desired behavior into a structure that realizes the behavior, i.e., interconnecting a set of electronic components to map an input into a desired output. In the first step, the specification of the desired behavior, which is typically described using a programming language, is compiled into an internal representation such as a parse tree or a graph. The internal representation contains the data and control flows or operations specified with the programming language. In the second step, the operations of the internal representation are assigned to control steps in a process referred to as scheduling. In the third step, the functional units that make up the data path are allocated. In the fourth step, the operations of the internal representation are assigned to hardware in a process referred to as binding In the fifth step, the controller is synthesized. In the sixth step the design is converted into real hardware. A brief description of high-level synthesis can be found in "Tutorial on High-Level Synthesis" by Michael C. McFarland et al., published in Proceeding of 25th Design Automation Conference, pp. 330–336 in June 1988, which is hereby incorporated herein by reference.

If high-level synthesis is not used, the controller structure is designed manually using hardware control or microprogramming. A drawback to this technique is that the controller structures are limited in use, time consuming to design, and prone to design errors. If high-level synthesis is used, the controller structure is generated automatically. However, currently available high-level synthesis techniques are limited to using a single clock. In addition, the prior art controller structures may include either single-thread execution, multiple-thread execution, or pipeline execution. Prior art high-level synthesis techniques are not capable of supporting single-thread execution, multiple-thread execution, and pipeline execution structures together, and can not provide fully automatic controller generation for multiple-clock designs.

Accordingly, it would be advantageous to have a controller structure and a method for generating the controller structure that supports multi-phase clocks, relative and absolute scheduling, arbitrarily nested conditional branches and loops, chaining, and multi-cycle operations. It would be of further advantage for the controller structure to be capable of supporting single-thread execution, multiple-thread execution, and pipeline execution structures together.

BRIEF DESCRIPTION OF THE DRAWINGS

FIG. 1 is a flow diagram of a method for generating a controller structure in accordance with an embodiment of the present invention;

FIG. 2 is a simple algorithmic description comprising hardware description language statements;

FIG. 3 illustrates the formation of the plurality of statement blocks in accordance with the flow diagram of FIG. 1;

FIG. 4 is a scheduling model in accordance with the flow diagram FIG. 1;

FIG. 5 is a sequencing/clustering model generated in accordance with the flow diagram of FIG. 1;

FIG. 8 is a block diagram of a sequence point circuit of the controller element of FIG. 7.

DETAILED DESCRIPTION OF THE DRAWINGS

Figure 6:
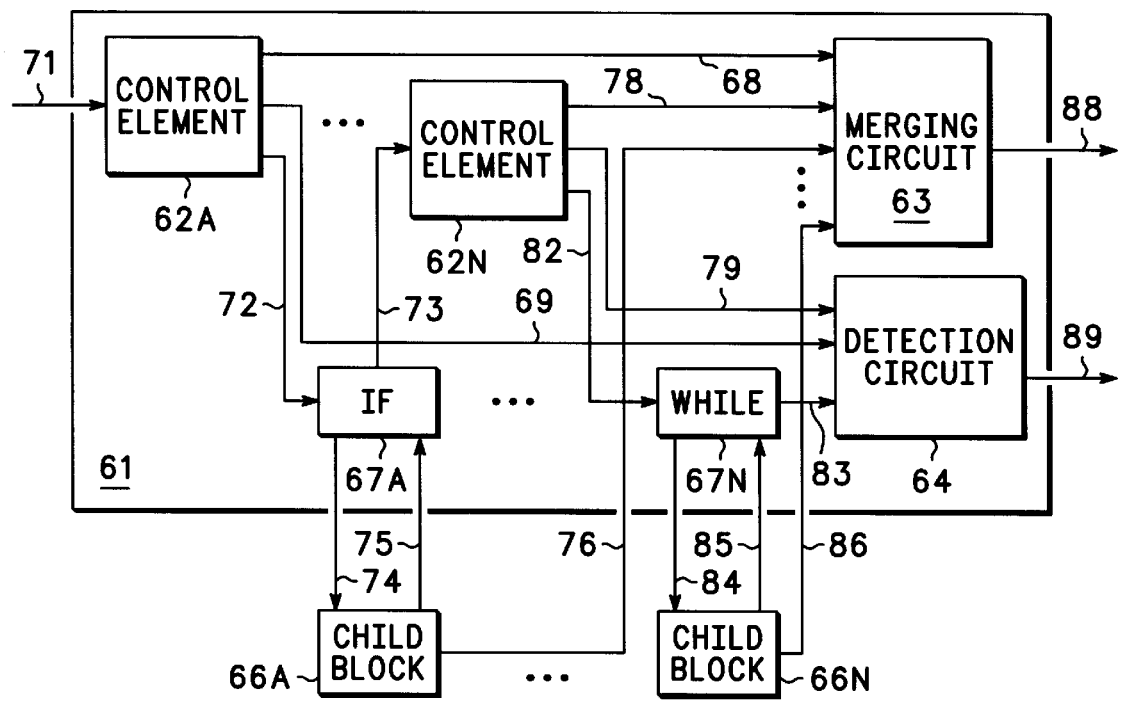
FIG. 6 is a block diagram of a control block template of the controller structure generated in accordance with the flow diagram of FIG. 1.

Generally, the present invention provides a new hierarchical controller structure and a method for generating the controller structure. In accordance with an embodiment of the present invention, a controller structure is generated automatically once the scheduling, the data path allocation, and the behavior-to-structure bindings have been determined. In accordance with the present invention, the control synthesis takes the scheduled behavior, the RTL data-path and the bindings between them as input and produces a synchronous control unit which will activate components in the data path accordingly. Briefly, the method for generating the controller structure includes the steps of providing a behavioral specification; providing scheduling, allocation, and binding of the behavioral specification; dividing the list of statements into a plurality of statement blocks; grouping the statements into clusters, and mapping each statement block into a control block; and mapping each cluster of statements into a control element.

FIG. 1 is a flow diagram 10 of a method for generating or synthesizing a controller structure in accordance with an embodiment of the present invention. In a first step 11, a behavioral specification is provided. As those skilled in the art are aware, a behavioral specification is an algorithmic description of, for example, a circuit, that describes the desired operation of the circuit from a high level. By way of example, the circuit is described using a hardware description language (HDL) such as, for example, Verilog. Behavioral specifications are further described in the "Tutorial on High-Level Synthesis" by Michael C. McFarland et al., which was incorporated herein by reference.

Briefly referring to FIG. 2, a simple algorithmic description comprising HDL statements is shown. More particularly, a partial high-level description 21 of a function that a circuit may perform to achieve some desired result is shown. In partial high-level description 21, if the variable "x" is true, then the sum of "i" and "j" is transferred to the variable "a". After the sum of "i" and "j" is transferred, other statements (not shown) may be specified by the algorithm. It should be understood that the statements that are not shown are indicated by vertical ellipses. If the variable "x" is not true, then the difference between "m" and "n" is transferred to the variable "a". Again, other statements (not shown) may be specified by the algorithm. In another portion of the description, the algorithm specifies that the variable "m" be transferred to variable "b" while the variable "y" is true. In yet another portion of the description, the algorithm specifies that the variable "n" be transferred to the variable "c" while the variable "z" is true. In still another portion of the description, the algorithm specifies that the variable "a" be transferred to variable "d", the sum of "a" and "b" be transferred to variable "e", the sum of "b" and "c" be transferred to variable "f", the difference between "b" and "c" be transferred to variable "g", and the product of "b" and "c" be transferred to variable "h". Again, the statements that are not shown are indicated by the horizontal ellipses.

Referring again to FIG. 1 and in the second step 12, the behavioral specification is scheduled, allocated, and bound.

In accordance with the present invention, scheduling includes assigning a set of attributes which describe different styles of executing or performing the behavioral specification. By way of example, each statement is assigned a "sequence point attribute," a "clock attribute," a "synchronization mode attribute," and a "clock cycle attribute." It should be noted that the number of attributes assigned to each statement is not a limitation of the present invention. The scheduling of each statement determines whether the scheduling type is absolute or relative. If the execution of a statement does not depend on any unbounded delay statements within the same statement block, it can be scheduled absolutely with respect to the beginning of the block. If the execution depends on an unbounded delay and/or the indeterminate delay statement within the statement block, it is scheduled relatively with respect to the completion of the unbounded delay and/or the indeterminate delay statements from which it depends. It should be understood that the sequence point of a statement is either the beginning of the block for absolute scheduling or the completion of all the unbounded delay or indeterminate delay statements that it depends on for relative scheduling. In addition, when multiple clocks are used, the scheduling of a statement may be synchronized such that its execution is delayed until the beginning of a new primary cycle. It should be understood that the primary cycle is a time period over which all the clocks in a system have a specified relation. For example, the specified relation may be specified as the relation between the periods of all the clocks relative to the slowest clock period.

In a third step 13, the list of statements is hierarchically divided into a plurality of statement blocks. FIG. 3 illustrates a plurality of statement blocks 22 including a top level statement block 23 and four nested statement blocks 24, 26, 27, and 28. Nested blocks 24 and 26 are child blocks of the statement "if(x)" in top level statement block 23. Nested block 27 is a child block of the statement "while(y)" and nested block 28 is a child block of the statement "while(z)" of top level statement block 23.

FIG. 4 illustrates a scheduling model 31 in tabular form which characterizes each statement of the behavioral specification in accordance with the set of attributes described with reference to second step 12 of FIG. 1, i.e., the "sequence point attribute," the "clock attribute," the "synchronization mode attribute," and the "clock cycle attribute." A first column 32 contains the control and behavioral statements. A second column 33 contains the type of scheduling associated with each control or behavioral statement, i.e., relative (R) or absolute (A). A third column 34 contains the synchronization mode attribute, i.e., synchronized (S) or unsynchronized (U). A fourth column 35 contains the clock attribute, and a fifth column 36 contains the clock cycle attribute.

FIG. 5 is a sequencing/clustering model 41 to illustrate clustering (step 14). The statements within the top level statement block 23 of FIG. 3 are grouped into five clusters according to their "sequence points," "clocks," and "synchronization mode" such that each cluster can be controlled by a single finite state machine. In accordance with the example shown in FIG. 5, the first cluster 42 includes the statements "if(x)," "while(y)," and "while(z)." The second cluster 43 includes the statement "d=a" and is the only element of the cluster because its sequence point 44, synchronization mode, and clock are unique to this statement. Likewise, sequence point 46 is unique to the statement "e=a+b" within cluster 45. Sequence points 48 and 51, on the other hand, are identical for the statements, "f=b+c", "g=b−c", and "h=b*c". However, the clock for the statements "f=b+c" and "g=b−c" is different from the clock for the statement "h=b*c". Therefore, the statements "f=b+c" and "g=b−c" form one cluster 47 and the statement "h=b*c" forms a separate cluster 49.

Referring again to FIG. 1, in step 15 each statement block is mapped into a control block structure using template 61 as described with reference to FIG. 6. Likewise, in a step 17 each statement cluster is mapped into a control element using a template 62 as described with reference to FIG. 7. Thus, each statement block has an associated control block structure and each cluster within the control block structure has a control element. It should be noted that the number of statement blocks will equal the number of control blocks, and there will be an equal or greater number of control elements. In other words, there will be a one-to-one mapping of the number of statement blocks to the number of control blocks, wherein each statement block will have one or more control elements.

FIG. 6 is a block diagram 60 of a control block structure template 61 which is used as a template for synthesizing a specific control block for each statement block in accordance with an embodiment of the present invention. Controller structures are also referred to as controllers or control blocks. The organization of the controller structure preserves the hierarchy embedded within its HDL behavioral description. It should be noted that there is one controller structure 61 for each statement block. Control block 61 comprises a one or more control elements 62A–62N coupled to merging logic circuitry 63.

Each control signal may be generated by one or more sources, and the merging logic is used to generate a single output signal. In accordance with the present invention each control signal is given a default value which is also the default value for its one or more control signal sources. In one embodiment, the merging logic is a logical OR function which merges control signals having a default value of zero. In another embodiment, the merging logic is a logical AND function which merges control signals having a default value of one. When any control signal source changes to a value other than its default value, the control signal is asserted. In the prior art, controller design techniques do not use default values for control signals. Hence, merging logic circuitry, e.g., a multiplexer, is used to determine which control signal is active at a particular time to select an output. Thus, an advantage of the present invention is that simple logical functions are used to realize the merging logic circuitry.

In addition, each control element 62A–62N is coupled to detection circuitry 64 that indicates when the control block is complete. Control elements 62A–62N are coupled to corresponding child blocks 66A–66N via branching logic circuitry 67A–67N. Child blocks 66A–66N are specific implementations of control block template 61.

More particularly, control element 62A receives a first handshaking signal at input terminal 71, which signal serves as a start signal for control block 61. Control element 62A is coupled to merging logic circuit, i.e., a logical function circuit, 63 via datapath control signal interconnect 68 and to block done detection circuit 64 via wait interconnect 69. Control element 62A is coupled to branching logic circuit 67A via an activation line 72. By way of example, branching logic circuit 67A realizes an "if" condition. Branching logic circuit 67A is coupled to control element 62N via a "complete-if" interconnect 73. In addition, branching logic circuit 67A is coupled to child block 66A via start and done handshake interconnects 74 and 75, respectfully. Child block 66A is coupled to merging logic circuit 63 via datapath control signal interconnect 76.

Likewise, control element 62N is coupled to merging logic circuit 63 via a control signal interconnect 78 and to block done detection circuit 64 via wait interconnect 79. Control element 62N is coupled to branching logic circuit 67N via an activation line 82. By way of example, branching logic circuit 67N realizes a "while" condition. Branching logic circuit 67N is coupled to detection circuit 64 via a "complete-while" interconnect 83. In addition, branching logic circuit 67N is coupled to child block 66N via start and done handshake interconnects 84 and 85, respectively. Child block 66N is coupled to merging logic circuit 63 via datapath control interconnect 86. An output of detection circuit 64 serves as an output 89 for a "done" handshake signal of control block 61. Further, an output of merging logic circuit 63 serves as datapath control output 88 of control block 61.

Figure 7:
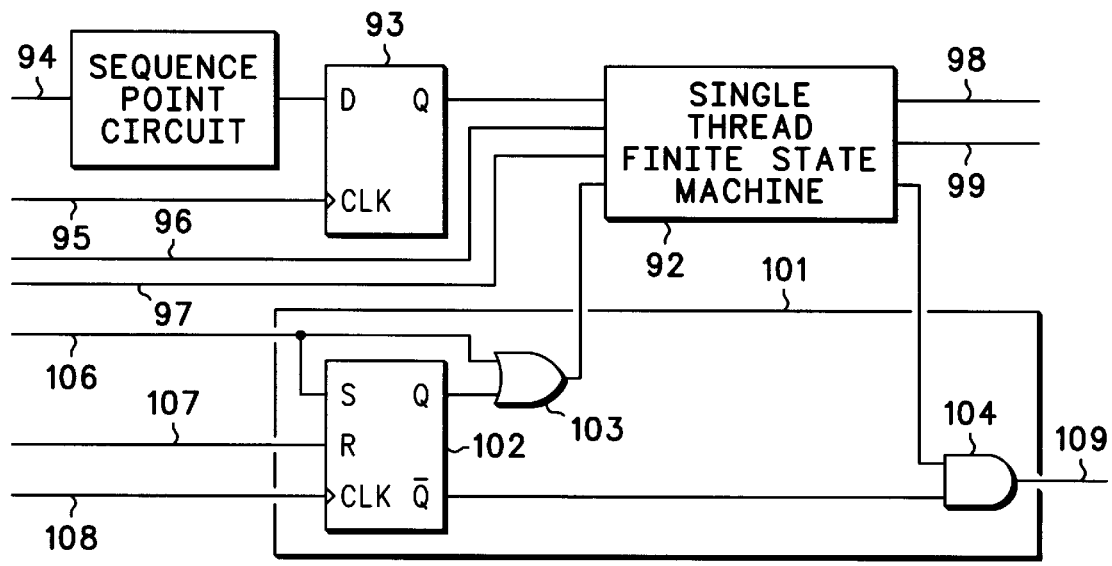
FIG. 7 is a block diagram of a control element template of the controller structure of FIG. 6.

FIG. 7 is a block diagram of a control element template 62. It should be noted that control element 62 is a template used for synthesizing control elements 62A–62N of FIG. 6. Control element template 62 comprises a sequence point circuit 91 coupled to a single-thread finite state machine (STFSM) 92 via a D-type synchronization flip-flop 93. It should be noted that flip-flop 93 is optional and used in control elements which have synchronized scheduling. Sequence point circuit 91 has an input 94 coupled for receiving a start signal for each required-complete signal. Although input 94 is shown as a single input, it should be understood that it represents one or more inputs. An output of sequence point circuit 91 is coupled to the data input of flip-flop 93. Sequence point circuit 91 is further described with reference to FIG. 8. A clock input 95 of flip-flop 93 is coupled for receiving a synchronization pulse. The output of flip-flop 93 is coupled to an enable input of STFSM 92. Further, STFSM 92 is coupled to a clock signal via a clock input 96 and to a condition indication signal via a condition input 97. A first output 98 of STFSM 92 serves a datapath control signal output for control element template 62. A second output 99 of STFM 92 serves as an activation output for a compound statement (e.g., "if", "while", and the like) for control element 62. It should be noted that although outputs 98 and 99 are shown as single outputs, they represent zero or more datapath control signal outputs and activation outputs, respectively. It should be noted that output 98 serves as a datapath control outputs of controller 61, i.e., it is coupled to merging logic circuit 63, and output 99 serves to provide activation control of the branching logic, i.e., branching logic 67A–67N, in FIG. 6.

Control element template 62 further includes a wait generation circuit 101. Wait generation circuit 101 comprises an S-R flip-flop 102 having a true output coupled to a first input of a NOR gate 103 and a complementary output coupled to a first input of an AND gate 104. The S-input of flip-flop 102 is coupled to the second input of NOR gate 103 and to an input terminal 106 for indicating when the operation is done or complete. The R-input 107 of flip-flop 102 is coupled for receiving a clock pulse signal and the clock input 108 is coupled for receiving a master clock input signal. The output of OR gate 103 is coupled to an input of STFSM 92. An output of STFSM is coupled to the second input of AND gate 104. The output 109 of AND gate 104 serves as the wait output of control element 62 for indicating that the task has been completed. It should be noted that wait generation circuit 101 is not needed in controllers having a single clock.

FIG. 8 illustrates a schematic diagram of sequence point circuit 91 which is comprised of one or more subportions 120A–120N. Sequence point circuit 91 provides a mechanism for latching in done signals from multiple sources and each subportion includes an S-R flip-flop 110A–110N coupled to an AND gate 111 via an OR gate 112A–112N, respectively. The output 113 of AND gate 111 provides an unsynchronized output enable signal for sequence point circuit 91. The S-input of flip-flop 110A is coupled to a first input of OR gate 112A and the output of flip-flop 110A is coupled to the second input of OR gate 112A. The output of OR gate 112A is coupled to a first input of AND gate 111. The S-input of flip-flop 111 serves as input 94A shown in FIG. 7. The R-input 115A of flip-flop 110A is coupled for receiving a control signal from STFSM 92 (shown in FIG. 7) and the clock input 116A is coupled for receiving a master clock signal. Likewise, the S-input of flip-flop 110N is coupled to a first input of OR gate 112N and the output of flip-flop 110N is coupled to the second input of OR gate 112N. The output of OR gate 112N is coupled to a second input of AND gate 111. The S-input of flip-flop 110N serves as input 94 shown in FIG. 6. The R-input 115N of flip-flop 110N is coupled for receiving a control signal from STFSM 92 (shown in FIG. 7) and the clock input 116A is coupled for receiving a master clock signal. It should be understood that the number of number of subportions is not a limitation of the present invention and that the vertical ellipses are used to indicate one or more subportions 120A–120N having one or more outputs coupled to AND gate 111.

It should be noted that the controller structure and template of the present invention are capable of supporting pipelining execution using the assumptions that scheduling is absolute, loops are not present, and a single clock is used. The modifications for using the present invention to support pipelining execution are known to those skilled in the art.

By now it should be appreciated that a controller structure and a method for generating the controller structure have been provided. In accordance with the present invention, a behavioral specification is hierarchically divided into statement blocks and statements from each statement block are grouped into clusters according to their sequence point, clock, and synchronization mode such that each cluster can be controlled by a single finite state machine. These attributes define the style of the controller for each cluster. An advantage of this technique is that cycle time is reduced because the controller is generated automatically. In addition, errors inherent in manual design techniques are eliminated. The present invention allows using simplified merging control logic. In addition, the present invention allows the formation of a controller structure capable of supporting single-thread execution, multiple-thread execution, and pipeline execution together. The total design is a collection of finite state machines running off of potentially different clocks. It should be noted that some of the finite state machines may be running off the same clock.

We claim:

1. A method for generating a controller structure, comprising the steps of:

inputting at least one behavioral specification comprising a list of statements;

scheduling, allocating, and binding of the at least one behavioral specification to produce a component netlist, dividing the list of statements of the at least one behavioral specification resulting from said step of scheduling, allocating, and binding into at least one statement block;

grouping the list of statements from each statement block into at least one cluster of statements for generating the controller structure that controls the component netlist that is being allocated by said step of scheduling, allocating, and binding;

mapping each statement block into at least one control block; and mapping each cluster of statements into a control element, wherein the at least one control block and the control element cooperate to form the controller structure, wherein said controller structure comprises:

a first finite state machine which serves as a first control element having at least one input and at least one output;

a second finite state machine which serves as a second control element having at least one input and at least one output; and a merging logic circuit having a plurality of inputs and an output, wherein a first output of the first finite state machine is coupled to a first input of the plurality of inputs of the merging logic circuit and a first output of the second finite state machine is coupled to a second input of the plurality of inputs of the merging logic circuit, wherein the first and second finite state machines and the merging logic circuit cooperate to form a controller structure.

2. The method of claim 1, wherein the step of scheduling, allocating, and binding of the at least one behavioral specification includes assigning a set of attributes describing a style of executing the at least one behavioral specification.

3. The method of claim 2, wherein assigning a set of attributes includes assigning a sequence point attribute, a clock attribute, a synchronization mode attribute, and a clock cycle attribute to each statement of the list of statements.

4. The method of claim 2, wherein assigning a set of attributes includes assigning a synchronization mode attribute and a clock attribute to each statement of the list of statements.

5. The method of claim 2, wherein assigning a set of attributes includes assigning a clock attribute to each statement of the list of statements.

6. The method of claim 2, wherein the step of grouping the list of statements from each statement block into at least one cluster of statements includes grouping the list of statements in accordance with a sequence point attribute, a clock attribute, and a synchronization mode attribute.

7. The method of claim 2, wherein the step of grouping the list of statements from each statement block into at least one cluster of statements includes grouping the list of statements in accordance with a sequence point attribute.

8. The method of claim 2, wherein the step of grouping the list of statements from each statement block into at least one cluster of statements includes grouping the list of statements in accordance with a clock attribute.

9. The method of claim 1, wherein the steps of mapping each statement block and each cluster of statements includes mapping each statement block of the at least one statement block using a control block template and mapping each cluster of statements using a control element template.

10. The method of claim 1, wherein the step of grouping the list of statements from each statement block into at least one cluster of statements includes forming the at least one cluster of statements to be controlled by a single finite state machine.

11. The method of claim 1, further including generating the controller structure capable of supporting single-thread execution, multiple-thread execution, and pipeline execution structures together.

12. The method of claim 1, further including generating the controller structure to support multiple clocks.

13. A controller structure template, comprising:

a first finite state machine which serves as a first control element having at least one input and at least one output;

a second finite state machine which serves as a second control element having at least one input and at least one output; and a merging logic circuit having a plurality of inputs and an output, wherein a first output of the first finite state machine is coupled to a first input of the plurality of inputs of the merging logic circuit and a first output of the second finite state machine is coupled to a second input of the plurality of inputs of the merging logic circuit, wherein the first and second finite state machines and the merging logic circuit cooperate to form a controller structure.

14. The controller structure template of claim 13, wherein the first finite state machine is coupled for receiving a first clock signal and the second finite state machine is coupled for receiving a second clock signal.

15. The controller structure template of claim 13, further including a done detection circuit having one input of the at least one input coupled to an output of the at least one output of the first finite state machine, and an output, wherein the done detection circuit indicates when control block containing at least the first finite state machine is complete.

16. The controller structure template of claim 13, wherein the merging logic circuit comprises a logical function circuit lacking additional data selection inputs.

17. The controller structure template of claim 16, wherein the logical function circuit comprises one of a logical AND function or a logical OR function.

18. The controller structure template of claim 13, further including a branching logic circuit, wherein the first control element is coupled to the merging logic circuit via the branching logic circuit.

19. The controller structure template of claim 18, further including a child block, wherein the child block is coupled to the controller structure template via the branching logic circuit.

20. A control element template for a controller structure, comprising:

a sequence point circuit having at least one input and an output; and a finite state machine having at least one input and at least one output, the output of the sequence point circuit coupled to a first input of the finite state machine, wherein the sequence point circuit and the finite state machine cooperate to form the controller structure.

21. The control element template of claim 20, wherein the output of the sequence point circuit is coupled to the first input of the finite state machine by a flip-flop.

22. The control element template of claim 20, further including a wait generation circuit having at least one input and at least one output, wherein a first output of the wait generation circuit is coupled to a second input of the finite state machine and a first output of the finite state machine is coupled to a first input of the wait generation circuit.

* * * * *

UNITED STATES PATENT AND TRADEMARK OFFICE
CERTIFICATE OF CORRECTION

PATENT NO. : 5,774,368
DATED : June 30, 1998
INVENTOR(S) : Chih-Tung Chen et al.

It is certified that error appears in the above-identified patent and that said Letters Patent is hereby corrected as shown below:

In column 6, claim 1, line 61, delete "," after "netlist" and insert --;-- therefor.

In column 8, claim 13, line 5, after "template" insert --for use with a controller structure generation method that generates a controller structure for controlling an integrated circuit component netlist--.

In column 8, claim 20, delete "A control element template for a controller structure," and insert --The controller structure template of claim 13, wherein said first and second control elements comprise:-- therefor.

In column 8, claim 20, line 46, delete "comprising:".

In column 8, claim 21, line 56, replace "control element" with --controller structure--.

In column 8, claim 22, line 59, replace "control element" with --controller structure--.

Signed and Sealed this

Twenty-third Day of February, 1999

Attest:

Q. TODD DICKINSON

*Attesting Officer*     *Acting Commissioner of Patents and Trademarks*